(12) United States Patent  (10) Patent No.: US 11,515,470 B2
Obata et al.  (45) Date of Patent: Nov. 29, 2022

(54) METHOD FOR PRODUCING PIEZOELECTRIC ELEMENT

(71) Applicant: NGK Insulators, Ltd., Nagoya (JP)

(72) Inventors: Hiroki Obata, Gifu (JP); Masayuki Uetani, Kasugai (JP); Ryusuke Ikeda, Ichinomiya (JP)

(73) Assignee: NGK Insulators, Ltd., Nagoya (JP)

( * ) Notice: Subject to any disclaimer, the term of this patent is extended or adjusted under 35 U.S.C. 154(b) by 296 days.

(21) Appl. No.: 16/814,160

(22) Filed: Mar. 10, 2020

(65) Prior Publication Data

US 2020/0212288 A1 Jul. 2, 2020

Related U.S. Application Data

(63) Continuation of application No. PCT/JP2018/033485, filed on Sep. 10, 2018.

(30) Foreign Application Priority Data

Sep. 12, 2017 (JP) .............................. JP2017-174830

(51) Int. Cl.
   *H01L 41/257* (2013.01)
   *H01L 41/083* (2006.01)

(52) U.S. Cl.
   CPC ........ *H01L 41/257* (2013.01); *H01L 41/0838* (2013.01)

(58) Field of Classification Search
   CPC .......................... H01L 41/257; H01L 41/0838
   See application file for complete search history.

(56) References Cited

U.S. PATENT DOCUMENTS

| 6,464,925 B1* | 10/2002 | Tomohiro | H01L 41/257 264/435 |
| 6,521,166 B1* | 2/2003 | Tomohiro | H01L 41/257 264/408 |
| 2003/0109082 A1* | 6/2003 | Koduri | H01L 23/3157 257/E23.129 |
| 2008/0030102 A1* | 2/2008 | Ohnishi | B41J 2/14201 310/317 |

(Continued)

FOREIGN PATENT DOCUMENTS

| JP | 2002-190457 A1 | 7/2002 |
| JP | 2013-161970 A1 | 8/2013 |
| JP | 2014-181126 A1 | 9/2014 |

OTHER PUBLICATIONS

International Search Report and Written Opinion (Application No. PCT/JP2018/033485) dated Nov. 20, 2018.

(Continued)

*Primary Examiner* — Peter Dungba Vo
*Assistant Examiner* — Jose K Abraham
(74) *Attorney, Agent, or Firm* — Burr & Brown, PLLC

(57) ABSTRACT

Provided is a method for producing a piezoelectric element in which a piezoelectric body substrate piece is subjected to polarization treatment and a piezoelectric element is produced. The method includes a first step in which the piezoelectric body substrate piece is held on a flat plate-shaped slightly adhesive sheet and a second step in which voltage is applied to the piezoelectric body substrate piece held on the slightly adhesive sheet and the piezoelectric body substrate piece is subjected to polarization treatment.

7 Claims, 6 Drawing Sheets

(56) References Cited

U.S. PATENT DOCUMENTS

| | | | | |
|---|---|---|---|---|
| 2009/0307885 A1* | 12/2009 | Nihei | ............... | H01L 41/257 |
| | | | | 29/25.35 |
| 2011/0074251 A1* | 3/2011 | Shibata | ............... | H01L 41/1873 |
| | | | | 310/360 |
| 2013/0069490 A1* | 3/2013 | Nakamura | ............ | H01L 41/047 |
| | | | | 310/364 |
| 2014/0285068 A1* | 9/2014 | Horikiri | ............... | H01L 41/316 |
| | | | | 310/365 |
| 2015/0194591 A1* | 7/2015 | Fujii | ............... | H01L 41/0825 |
| | | | | 318/116 |
| 2017/0268973 A1* | 9/2017 | Arai | ............... | G01R 29/22 |

OTHER PUBLICATIONS

English translation of the International Preliminary Report on Patentability (Chapter I)(Application No. PCT/JP2018/033485) dated Mar. 17, 2020.

* cited by examiner

FIG. 5

[TABLE 1]

| | MATERIAL | HEAT RESISTANT TEMPERATURE [°C] | HOLDING POWER [kgf/cm²] | POLARIZABILITY | EVALUATION RESULT |
|---|---|---|---|---|---|
| SAMPLE 1 | FLUORORESIN A | 260 | 0.16 | 1.52 | ○ |
| SAMPLE 2 | FLUORORESIN B | 260 | 0.34 | 1.51 | ○ |
| SAMPLE 3 | FLUORORUBBER | 260 | 0.48 | 1.52 | ○ |
| SAMPLE 4 | URETHANE A | 90 | 0.28 | 1.48 | ○ |
| SAMPLE 5 | URETHANE B | 90 | 0.48 | 1.41 | ○ |
| SAMPLE 6 | URETHANE C | 90 | 0.87 | 1.00 | × |
| SAMPLE 7 | OLEFIN A | 90 | 0.38 | 1.47 | ○ |
| SAMPLE 8 | OLEFIN B | 80 | 0.43 | 1.00 | × |
| SAMPLE 9 | ACRYLIC | 80 | 0.97 | 1.00 | × |

METHOD FOR PRODUCING PIEZOELECTRIC ELEMENT

CROSS-REFERENCE TO RELATED APPLICATIONS

This application is a Continuation of International Application No. PCT/JP2018/033485 filed on Sep. 10, 2018, which is based upon and claims the benefit of priority from Japanese Patent Application No. 2017-174830 filed on Sep. 12, 2017, the contents all of which are incorporated herein by reference.

TECHNICAL FIELD

The present invention relates to a piezoelectric element manufacturing method for manufacturing (producing) a piezoelectric element by applying a polarization treatment to a piezoelectric substrate.

BACKGROUND ART

Conventionally, in manufacture of piezoelectric elements by applying a polarization treatment to a piezoelectric substrate, the application of an electric field causes the piezoelectric substrate to deform. When the polarization treatment is applied to a large-sized piezoelectric substrate, the amount of strain increases in proportion to the size of the piezoelectric substrate. There is a problem that the piezoelectric substrate is damaged if the amount of strain is too large. As such, in the technique of Japanese Laid-Open Patent Publication No. 2002-190457, with a large-sized piezoelectric substrate stuck on an adhesive sheet, the piezoelectric substrate is divided into a plurality of small-sized piezoelectric substrate pieces by dicing or the like. Then, the polarization treatment is applied to each piezoelectric substrate piece, with the plurality of piezoelectric substrate pieces being stuck on the adhesive sheet.

Further, in the method disclosed in Japanese Laid-Open Patent Publication No. 2014-181126, the piezoelectric treatment is performed by using a tray having formed therein a plurality of recesses that can accommodate piezoelectric substrate pieces in a horizontal state.

SUMMARY OF INVENTION

However, in the method disclosed in Japanese Laid-Open Patent Publication No. 2002-190457, the adhesive sheet hinders the deformation caused by the strain of the piezoelectric substrate pieces that occurs in the polarization treatment. As a result, the stress occurring in the piezoelectric substrate pieces in the polarization treatment (stress caused by the piezoelectric effect) becomes large and may cause cracks in the piezoelectric substrate pieces.

In the method described in Japanese Laid-Open Patent Publication No. 2014-181126 that employs the tray, as shown in FIG. 6A, it is necessary to set the plane size of each recess 104 in the tray 102 slightly larger than the plane size of the piezoelectric substrate pieces 100 so that the piezoelectric substrate pieces 100 can be easily put into and taken out of the recesses 104. Consequently, the piezoelectric substrate pieces 100 may be turned over due to impacts during transportation of the tray 102 between processes or during operation of installing the tray 102 in apparatus. Also, the piezoelectric substrate pieces 100 may be lost during handling. Furthermore, as shown in FIG. 6B, in the application of a polarization treatment to the piezoelectric substrate pieces 100, the position of the piezoelectric substrate piece 100 may be displaced in the recess 104, so that the contact between the probe 106 and terminal 108 cannot be stable, possibly resulting in inferior performance due to polarization failure.

The present invention has been devised taking such problems into consideration and an object of the present invention is to provide a piezoelectric element manufacturing method that offers the effects below:

(a) even if a tray on which a plurality of piezoelectric substrate pieces are placed in alignment is subject to impact, the polarization treatment can be performed while keeping the piezoelectric substrate pieces in a state of the alignment; and (b) the strain of the piezoelectric elements that occurs at the application of voltage is not hindered.

[1] According to the present invention, a piezoelectric element manufacturing method for manufacturing a piezoelectric element by applying a polarization treatment to a piezoelectric substrate piece, includes: a first step of holding the piezoelectric substrate piece on a flat-plate-shaped slightly adhesive sheet; and a second step of applying a voltage to the piezoelectric substrate piece held on the slightly adhesive sheet to apply a polarization treatment to the piezoelectric substrate piece.

According to this method, the piezoelectric substrate piece is held on the slightly adhesive sheet. Accordingly, even if a tray on which a plurality of piezoelectric substrate pieces are arranged in alignment undergoes impact, the polarization treatment can be performed while keeping the alignment of the piezoelectric substrate pieces. Furthermore, the strain of the piezoelectric elements that occurs at the application of voltage is not hindered.

[2] In the present invention, the piezoelectric substrate piece may have a first terminal and a second terminal formed on one surface thereof, the first step may hold, on the slightly adhesive sheet, the other surface of the piezoelectric substrate piece that is opposite to the one surface, and the second step may apply the voltage between the first terminal and the second terminal of the piezoelectric substrate piece.

The first step holds on the slightly adhesive sheet the piezoelectric substrate piece by its other surface opposite to the one surface. Accordingly, the second step can perform the piezoelectric treatment by applying the voltage between the first terminal and second terminal that are formed on the one surface of the piezoelectric substrate piece. That is, the polarization treatment can be easily applied to the piezoelectric substrate piece with the piezoelectric substrate piece held on the slightly adhesive sheet.

[3] In the present invention, preferably, the piezoelectric substrate piece has a size having a length of 0.2 to 0.4 mm, a width of 0.8 to 1.2 mm, and a thickness of 0.05 to 0.2 mm.

In the conventional polarization methods, a mainstream approach is to apply the polarization treatment to a substrate and then divide the substrate into individual pieces. However, if a polarization treatment is applied to a large-sized substrate in order to obtain the target products for the present invention, the products suffer cracks or the like.

As such, the present invention applies the polarization treatment to separated pieces, i.e., to the piezoelectric substrate pieces having a small size of a length of 0.2 to 0.4 mm, a width of 0.8 to 1.2 mm, and a thickness of 0.05 to 0.2 mm. This prevents occurrence of cracks etc. in the piezoelectric substrate pieces in the polarization treatment and thus offers improved yield.

[4] In the present invention, when the piezoelectric substrate piece is subjected to the polarization treatment, a strain of 1500 to 4000 ppm in the d31 direction (a direction along the electrode surface) may occur with an electric field of 2.0 to 4.0 kV/mm.

[5] In the present invention, preferably, the flat-plate-shaped slightly adhesive sheet is bonded on a base material, and the base material is flat in at least a plane on which the slightly adhesive sheet is bonded, and the slightly adhesive sheet is bonded within the plane. This prevents the slightly adhesive sheet from being wrinkled or partially turned over by air-conditioning wind etc., so that a plurality of piezoelectric substrate pieces can be held stably. Further, the base material is preferably made of metal or ceramic, and more preferably made of metal from the perspective of processing accuracy and heat conduction during heating, and still more preferably made of aluminum from the perspective of heat conduction.

[6] In the present invention, preferably, the slightly adhesive sheet holds the piezoelectric substrate piece and does not hinder the strain of the piezoelectric substrate piece that occurs when the voltage is applied.

Then, even if a strain of 1500 to 4000 ppm occurs in the d31 direction at an electric field of 2.0 to 4.0 kV/mm when the piezoelectric substrate piece is subjected to the polarization treatment, it is possible to apply the polarization treatment without hindering the strain, with the piezoelectric substrate piece held on the slightly adhesive sheet.

[7] In the present invention, preferably, the slightly adhesive sheet has a heat resistant temperature equal to or higher than 90° C. and a holding power equal to or less than 0.50 kgf/cm$^2$.

[8] In the present invention, preferably, the slightly adhesive sheet has a surface resistance equal to or greater than $10^{16}$ ohms, a Young's modulus of 5.0 to 10.0 MPa, and a heat conductivity equal to or greater than 0.05 W/mK.

The piezoelectric element manufacturing method according to the present invention offers the effects below:

(a) even if a tray on which a plurality of piezoelectric substrate pieces are arranged in alignment undergoes impact, a polarization treatment can be performed while keeping the alignment of the piezoelectric substrate pieces; and (b) the strain of the piezoelectric elements that occur at the application of voltage is not hindered.

BRIEF DESCRIPTION OF DRAWINGS

FIG. 5 is Table 1 showing the details of samples 1 to 9 and the results of evaluation.

DESCRIPTION OF EMBODIMENTS

An embodiment of the piezoelectric element manufacturing method of the present invention will now be described referring to FIGS. 1A to 6B. In this specification, the word "to" indicating a numerical range is used to mean that the range includes the preceding and following numerical values as its lower and upper limit values.

Figure 1A:
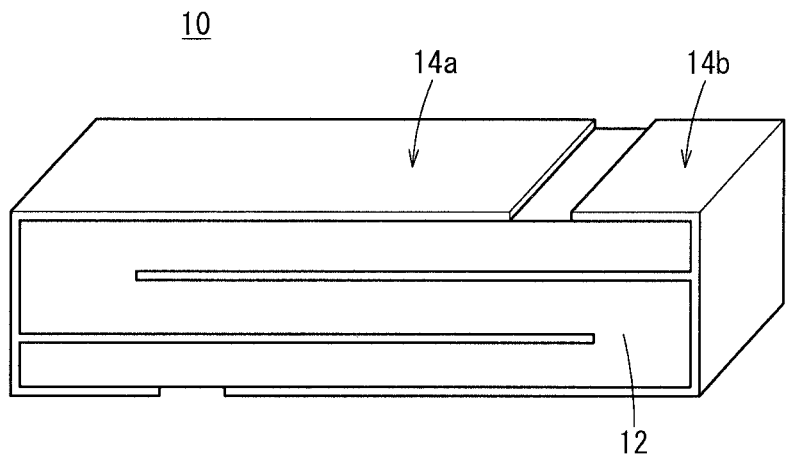
FIG. 1A is a perspective view showing an example of a piezoelectric element that is manufactured by a piezoelectric element manufacturing method according to the present embodiment.

As shown in FIG. 1A, for example, a piezoelectric element 10 manufactured by the piezoelectric element manufacturing method of this embodiment includes an element body 12 composed of perovskite structure etc. and a pair of electrodes 14a, 14b that are formed, for example, on upper and lower surfaces of the element body 12. The piezoelectric element 10 has a structure in which the element body 12 is formed as a laminated structure and the pair of electrodes 14a, 14b are each formed into a comb teeth shape. In this case, the pair of electrodes 14a, 14b are formed in such a manner that they appear on the upper surface of the element body 12.

Figure 1B:
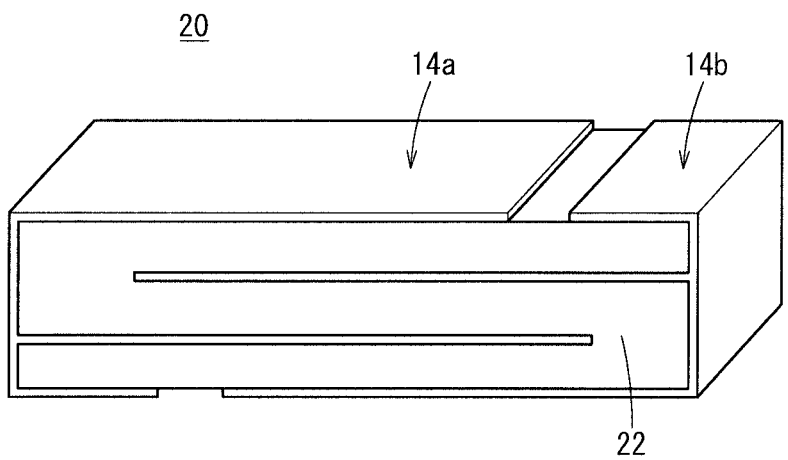
FIG. 1B is a perspective view illustrating a piezoelectric substrate piece.
Figure 2:
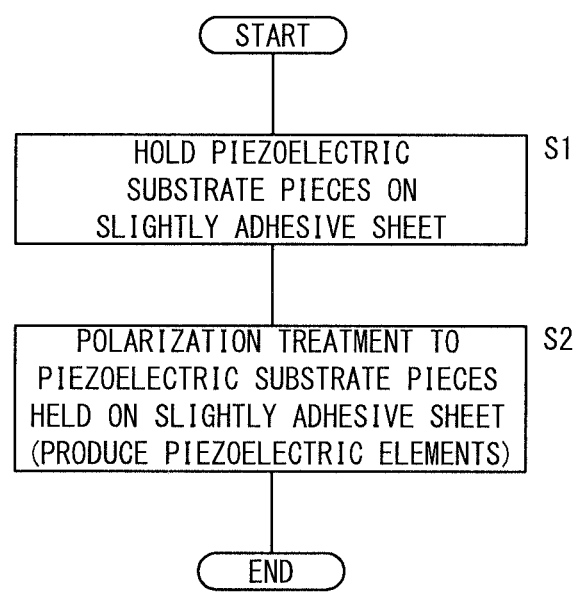
FIG. 2 is a flowchart showing the piezoelectric element manufacturing method according to the present embodiment.
Figure 3A:
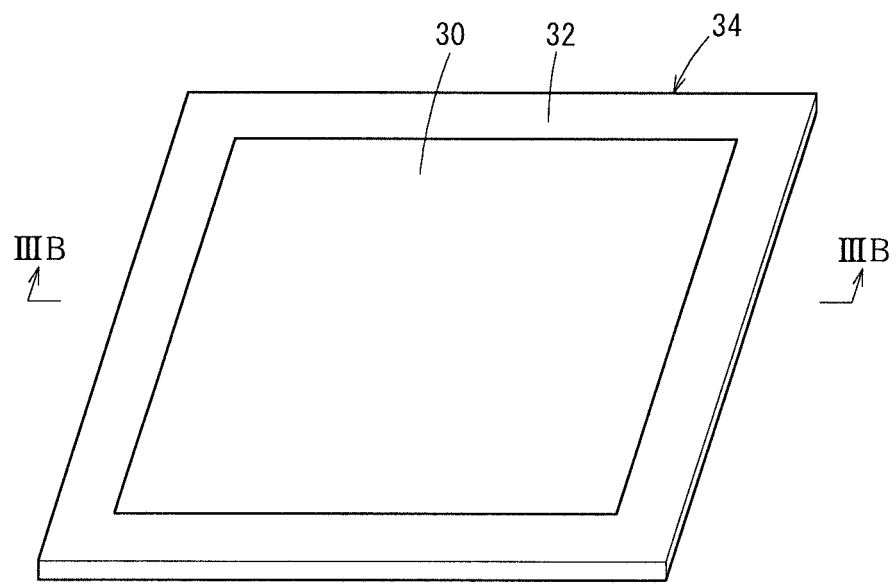
FIG. 3A is a perspective view showing an example of a tray having a slightly adhesive sheet that is bonded on a base material.
Figure 3B:
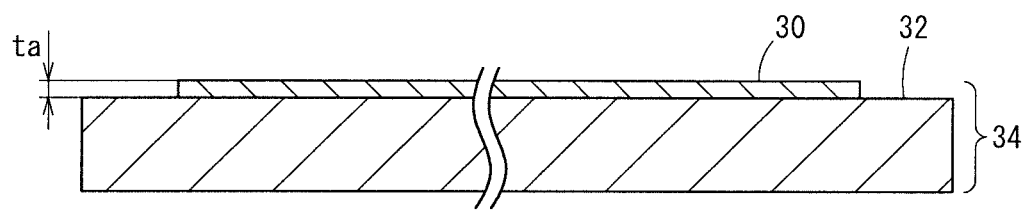
FIG. 3B is a cross sectional view taken along line IIIB-IIIB in FIG. 3A.

Then, in the piezoelectric element manufacturing method of this embodiment, as shown in step S1 of FIG. 2, piezoelectric substrate pieces 20 (see FIG. 1B) are held on a flat-plate-shaped slightly adhesive sheet 30 (see FIGS. 3A and 3B). Subsequently, in step S2, a voltage is applied to the piezoelectric substrate pieces 20 held on the slightly adhesive sheet 30 so as to polarize the piezoelectric substrate pieces 20, whereby the piezoelectric elements 10 are obtained.

The piezoelectric substrate pieces 20 are obtained by cutting a large-sized piezoelectric substrate (not shown) into a plurality of pieces. As shown in FIG. 1B, like the piezoelectric element 10 (see FIG. 1A) described above, the piezoelectric substrate piece 20 includes a substrate body 22 and a pair of electrodes 14a, 14b formed, for example, on the upper and lower surfaces of the substrate body 22. The size of the piezoelectric substrate piece 20 has a length of 0.2 to 0.4 mm, a width of 0.8 to 1.2 mm, and a thickness of 0.05 to 0.2 mm.

As shown in FIGS. 3A and 3B, the plate-shaped slightly adhesive sheet 30 is bonded on a base material 32 made of metal or ceramic. That is, the slightly adhesive sheet 30 and the base material 32 form one tray 34. It is preferred that at least a plane of the base material 32 on which the slightly adhesive sheet 30 is bonded is flat, and that the slightly adhesive sheet 30 is bonded within the plane. This prevents the slightly adhesive sheet 30 from being wrinkled or partially turned over by air-conditioning wind etc., so that the plurality of piezoelectric substrate pieces 20 can be held stably. Further, more preferably, the base material 32 is made of metal from the perspective of processing accuracy and heat conduction during heating, and still more preferably, it is made of aluminum from the perspective of heat conduction.

Figure 4A:
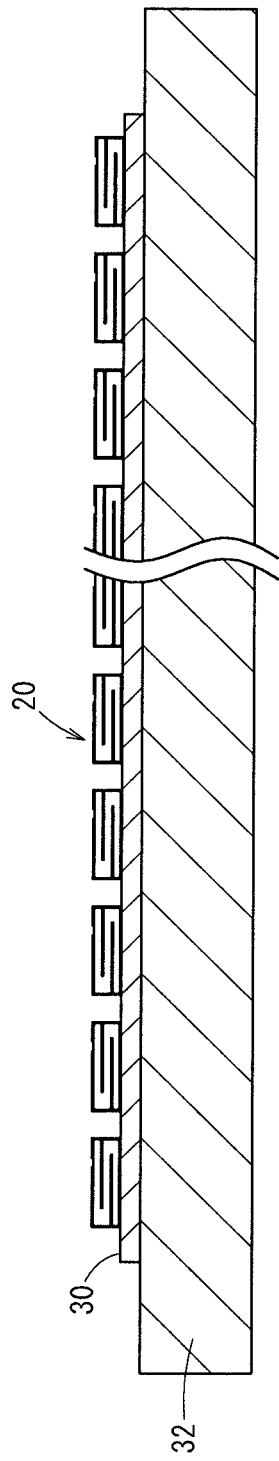
FIG. 4A is a partially-omitted cross sectional view illustrating a plurality of piezoelectric substrate pieces held on the slightly adhesive sheet bonded on the base material.

Thus, in step S1, as shown in FIG. 4A, the plurality of piezoelectric substrate pieces 20 are aligned (arranged) and held on the slightly adhesive sheet 30 of the tray 34 using an alignment jig, for example. As to the manner of the alignment, for example, it is preferable to arrange the plurality of piezoelectric substrate pieces 20 in a matrix, with the plurality of piezoelectric substrate pieces 20 arranged in a length direction and width direction. It is also preferred that the slightly adhesive sheet 30 can keep the alignment of the plurality of piezoelectric substrate pieces 20 even when subjected to impact through the base material 32 or directly.

Figure 4B:
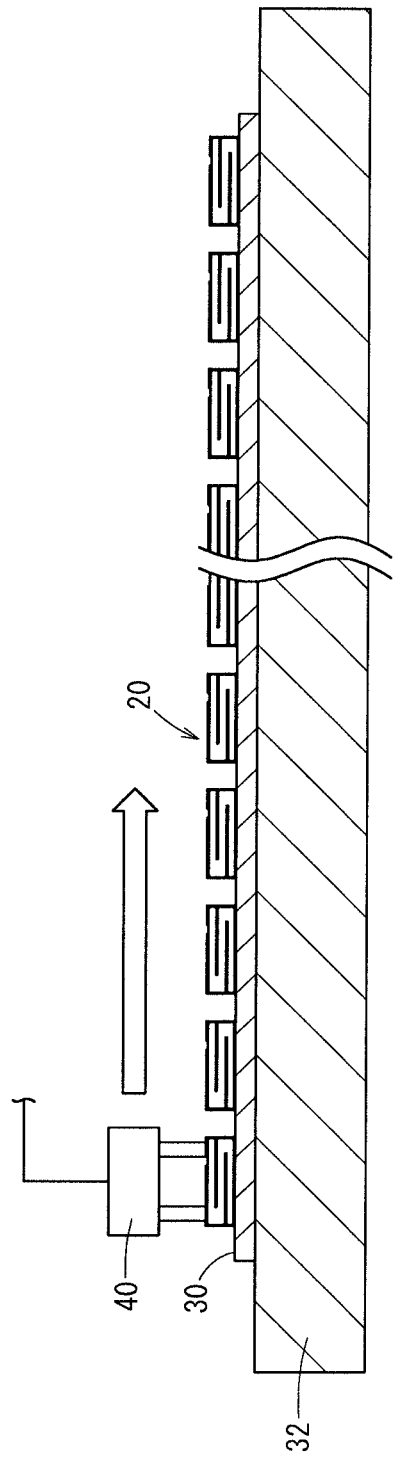
FIG. 4B is a cross sectional view illustrating a situation where a piezoelectric treatment is being applied to the plurality of piezoelectric substrate pieces held on the slightly adhesive sheet.

As shown in FIG. 4B, the polarization treatment in step S2 is performed with the plurality of piezoelectric substrate pieces 20 aligned on the slightly adhesive sheet 30 of the tray 34. For example, the polarization treatment is applied to the plurality of piezoelectric substrate pieces 20 in turn by using one voltage application device 40. Needless to say, the polarization treatment may be applied to the plurality of piezoelectric substrate pieces 20 at once, or separately in multiple times, using multiple voltage application devices 40 connected thereto.

In the conventional polarization treatment processes, a mainstream approach is to first apply polarization treatment to a substrate, i.e., to a large-sized piezoelectric substrate, and then divide the substrate into individual pieces. However, applying polarization treatment to a large-sized substrate causes breakage and distortion. Accordingly, in this embodiment, the polarization treatment is applied to the pieces obtained by dividing the piezoelectric substrate, i.e., to the piezoelectric substrate pieces 20. When each piezoelectric substrate piece 20 undergoes the polarization treatment, a strain of 1500 to 4000 ppm occurs in d31 direction (a direction along the electrode surface) at an electric field of 2.0 to 4.0 kV/mm.

It is hence preferred that the slightly adhesive sheet 30 has such a holding power as not to hinder the strain of the plurality of piezoelectric substrate pieces 20 that occurs during the polarization treatment in step S2. That is, the holding of the piezoelectric substrate pieces 20 by the slightly adhesive sheet 30 corresponds to physical adhesion (secondary bond, intermolecular bond), which is one of the adhesion principles.

Preferably, the slightly adhesive sheet 30 has a surface resistance equal to or greater than $10^{16}$ ohms, a Young's modulus of 5.0 to 10.0 MPa, a heat conductivity equal to or greater than 0.05 W/mK, a holding power equal to or less than 0.50 kgf/cm$^2$, and a heat resistant temperature equal to or higher than 90° C. The holding power of the slightly adhesive sheet 30 is preferably 0.10 kgf/cm$^2$ or higher.

EXAMPLES

First Example

A first example examined a preferable relationship between the heat resistant temperature and holding power of the slightly adhesive sheet 30 constituting the tray 34.

Specifically, samples 1 to 9 (slightly adhesive sheets 30) were prepared and bonded respectively on base materials 32 to make nine trays 34 corresponding to the samples 1 to 9. Then, material, heat resistant temperature (° C.), holding power (kgf/cm$^2$), and polarizability of the samples were examined. Material of the base material 32 was aluminum.
[Samples 1 to 9]
The samples 1 to 9 all had a thickness "ta" (see FIG. 3B) of 0.5 mm. Materials of the samples 1 and 2 were fluororesin A and fluororesin B of different kinds. Material of the sample 3 was fluororubber. Materials of the samples 4, 5, 6 were urethane A, urethane B, and urethane C of different kinds. Materials of the samples 7, 8 were olefin A and olefin B of different kinds. Material of the sample 9 was acrylic.
<Measurement Methods>
(Heat Resistant Temperature)
Heat resistant temperatures (° C.) of the samples 1 to 9 were measured as shown below.

[Measurement Device]
Handy-Type Thermometer
[Measurement Method]
Trays corresponding to the samples 1 to 9 (slightly adhesive sheets 30) were set on a hot plate and the temperature was measured by putting the probe of the thermometer in direct contact at a center of the samples 1 to 9. The current supplied to the hot plate was controlled such that the measurement temperature varies at intervals of 10 (° C.). Then, the upper limit temperature (measurement temperature) at which no bubbles occur at the boundary between the sample 1 to 9 and the base material was obtained as the heat resistant temperature.
(Holding Power)
Holding powers (kgf/cm$^2$) of the samples 1 to 9 were measured as shown below.
[Measurement Device]
Force Gauge
[Measurement Method]
Nine trays were prepared where the samples 1 to 9 (slightly adhesive sheets 30) were respectively bonded on the upper surfaces of nine base materials. A cylindrical probe made of steel and having a 1-cm$^3$ contact surface (with a circular outer circumference and rough surface) was pressed against the sample 1 to 9 of each tray (slightly adhesive sheet 30) for 15 seconds at a load of 100 gf. Subsequently, the probe was drawn up at a constant speed of 0.2 mm/s, and the maximum load indicated by the force gauge when the probe separates apart from the sample 1 to 9 (slightly adhesive sheet 30) was obtained as the holding power of the sample 1 to 9.
(Polarizability)
Polarizability was obtained by placing piezoelectric elements directly on the samples 1 to 9 and performing polarization treatment actually. That is, for each of the samples 1 to 9, the operation described above was performed 100 times and the average was obtained as the polarizability of each of the samples 1 to 9.
[Polarization Device]
LCR Meter
[Measurement Method]
Polarization treatment was actually applied to the piezoelectric elements and polarizability was calculated on the basis of capacitance value before polarization and capacitance value after polarization.

Polarizability=post-polarization capacitance value/ pre-polarization capacitance value <Evaluation>
Samples that exhibited polarizability larger than 1.00 were evaluated to be suitable for polarization treatment and were regarded as acceptance. That is, as the results of evaluation, samples with polarizability larger than 1.00 were evaluated as "O" and samples with polarizability of 1.00 or less were evaluated as "x". Table 1 of FIG. 5 shows the details of the samples and the results of evaluation thereof.

The results of evaluation show that preferred slightly adhesive sheets 30 have heat resistant temperatures equal to or higher than 90° C. and holding powers equal to or less than 0.50 kgf/cm$^2$.

Second Example

A second example examined the yield and retry rate of an example and a comparative example.

In the example, the slightly adhesive sheet 30 of the sample 1 was used as the tray 34 having no partitions as shown in FIG. 4A. That is, in the example, 100 piezoelectric substrate pieces 20 were held in alignment on the slightly adhesive sheet 30 of the sample 1 above by using an alignment device, the surface temperature of the base material 32 on which the slightly adhesive sheet 30 was bonded was set at 90±5° C., and a polarization treatment was conducted by applying a voltage of 53±2 V between the pair of electrodes 14a, 14b of each piezoelectric substrate piece 20.

The comparative example used the tray 102 (see FIG. 6A) only having partitions for holding, without slightly adhesive sheet 30. In the comparative example, the polarization treatment was performed using the tray 102 shown in FIG. 6A. The tray 102 has 100 recesses 104 formed therein. Using a loading jig, 100 piezoelectric substrate pieces 100 were put in the 100 recesses 104, one piezoelectric substrate piece 100 in each recess 104. Subsequently, a voltage of 53±2 V was applied between the pair of electrodes of each piezoelectric substrate piece 100 for polarization.

[Evaluation]

In the example and comparative example, the ratio of the number of normally polarized piezoelectric substrate pieces to the 100 piezoelectric substrate pieces, i.e., (the number of normal pieces/100)×100(%) was calculated as the yield. As a result, the example showed a ratio of 80% and the comparative example 60%.

Further, the retry rate of polarization treatment was examined for the example and the comparative example. The comparative example showed 200 retries per 1000 test pieces, resulting in a retry rate of 0.2. In contrast, the example showed 30 retries per 1000 test pieces, resulting in a low retry rate of 0.03. A tray 34 having no partitions as shown in FIG. 4A and no slightly adhesive sheet 30 was unable to hold piezoelectric substrate pieces 20 and incapable of measurement of retry rate.

"Retry" in the example and comparative example means that polarization treatment is conducted again when the property value measured by bringing the probe into contact with the piezoelectric element was not correct. "Retry rate" means the rate of the number of retries to the number of test pieces, i.e., the number of retries/the number of test pieces.

Figure 6A:
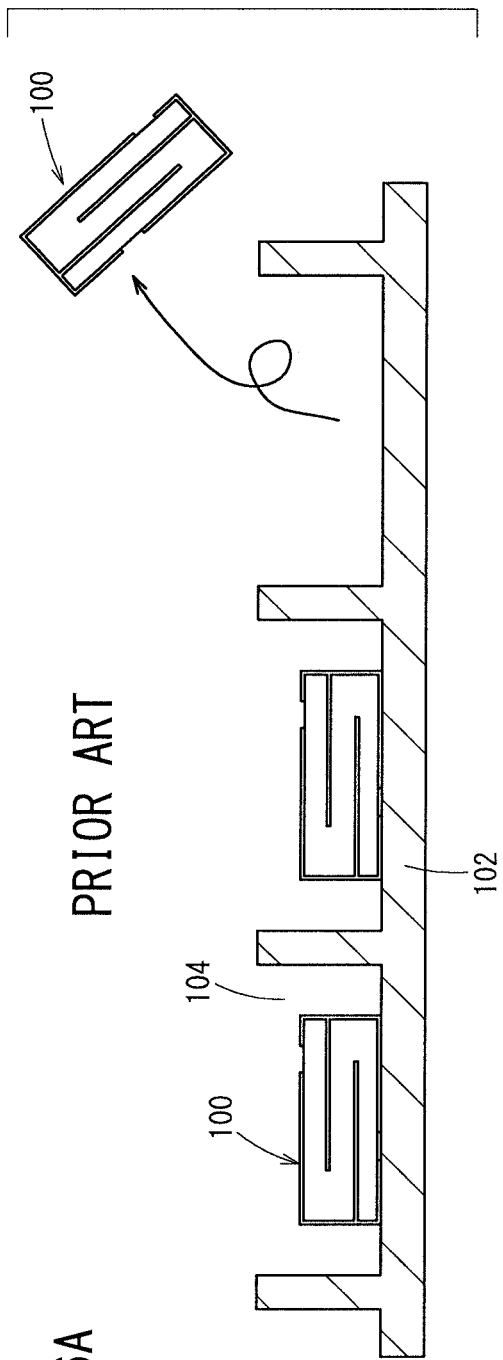
FIG. 6A is an explanatory diagram showing an example of a problem of the use of a conventional tray.
Figure 6B:
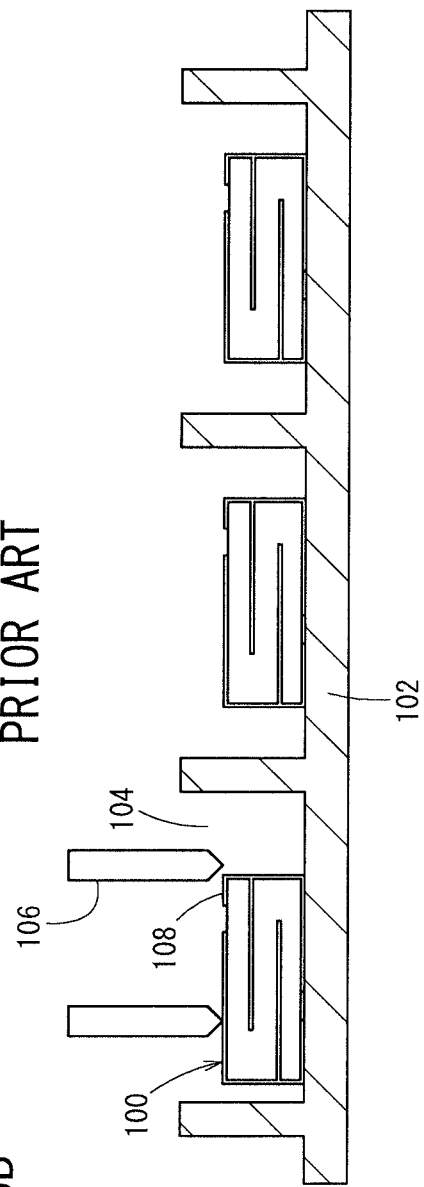
FIG. 6B is an explanatory diagram showing another example of a problem of the use of the conventional tray.

The results above showed that fixing the piezoelectric substrate pieces 20 on the slightly adhesive sheet 30 offers improved yield and decreased retry rate and thus enables more efficient manufacture of piezoelectric elements 10, as compared to the case where the piezoelectric substrate pieces 100 are held only with the frame of the tray 102, using the tray 102 without the slightly adhesive sheet 30 as shown in FIG. 6A.

The piezoelectric element manufacturing method according to the present invention is not limited to the above-described embodiments and various configurations are of course possible without departing from the essence and gist of the present invention.

The invention claimed is:

1. A piezoelectric element manufacturing method for manufacturing a piezoelectric element by applying a polarization treatment to an unpolarized piezoelectric substrate piece, the method comprising:
   a first step of applying the polarization treatment to a plurality of unpolarized piezoelectric pieces that are temporarily holding on a flat-plate-shaped slightly adhesive sheet, the flat-plate-shaped slightly adhesive sheet being bonded on a base material to form a tray; and
   a second step of simultaneously applying a voltage to the unpolarized piezoelectric substrate pieces held on the slightly adhesive sheet to apply the polarization treatment to the unpolarized piezoelectric substrate pieces,
   wherein the slightly adhesive sheet has a surface resistance equal to or greater than $10^{16}$ ohms, a Young's modulus of 5.0 to 10.0 MPa, and a heat conductivity equal to or greater than 0.05 W/mK.

2. The piezoelectric element manufacturing method according to claim 1, wherein
   the unpolarized piezoelectric substrate piece has a first terminal and a second terminal formed on one surface thereof,
   the first step holds, on the slightly adhesive sheet, another surface of the unpolarized piezoelectric substrate piece that is opposite to the one surface, and
   the second step applies the voltage between the first terminal and the second terminal of the unpolarized piezoelectric substrate piece.

3. The piezoelectric element manufacturing method according to claim 1, wherein the unpolarized piezoelectric substrate piece has a size having a length of 0.2 to 0.4 mm, a width of 0.8 to 1.2 mm, and a thickness of 0.05 to 0.2 mm.

4. The piezoelectric element manufacturing method according to claim 1, wherein, when the unpolarized piezoelectric substrate pieces are subjected to the polarization treatment, a strain of 1500 to 4000 ppm in a d31 direction occurs with an electric field of 2.0 to 4.0 kV/mm.

5. The piezoelectric element manufacturing method according to claim 1, wherein
   the base material is flat in at least a plane on which the slightly adhesive sheet is bonded, and the slightly adhesive sheet is bonded within the plane.

6. The piezoelectric element manufacturing method according to claim 1, wherein the slightly adhesive sheet holds the unpolarized piezoelectric substrate pieces and does not hinder a strain of the unpolarized piezoelectric substrate pieces that occurs when the voltage is applied.

7. The piezoelectric element manufacturing method according to claim 1, wherein the slightly adhesive sheet has a heat resistant temperature equal to or higher than 90° C. and a holding power equal to or less than 0.50 kgf/cm$^2$.

* * * * *